(12) United States Patent
Zeng (10) Patent No.: US 7,633,102 B2
(45) Date of Patent: Dec. 15, 2009

(54) LOW VOLTAGE HIGH DENSITY TRENCH-GATED POWER DEVICE WITH UNIFORMLY DOPED CHANNEL AND ITS EDGE TERMINATION

(75) Inventor: Jun Zeng, Torrance, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 10 days.

(21) Appl. No.: 11/866,072

(22) Filed: Oct. 2, 2007

(65) Prior Publication Data

US 2008/0023759 A1  Jan. 31, 2008

Related U.S. Application Data

(60) Continuation of application No. 11/204,552, filed on Aug. 16, 2005, now abandoned, which is a continuation of application No. 10/795,723, filed on Mar. 5, 2004, now Pat. No. 6,946,348, which is a division of application No. 10/138,913, filed on May 3, 2002, now Pat. No. 6,784,505.

(51) Int. Cl.
*H01L 27/088* (2006.01)

(52) U.S. Cl. ............... 257/287; 257/341; 257/401; 257/E21.549; 257/E29.201

(58) Field of Classification Search ............. None
See application file for complete search history.

(56) References Cited

U.S. PATENT DOCUMENTS 5,072,266 A * 12/1991 Bulucea et al. ............. 257/330
5,674,766 A * 10/1997 Darwish et al. ............. 438/270

* cited by examiner

*Primary Examiner*—Evan Pert
*Assistant Examiner*—Scott R Wilson
(74) *Attorney, Agent, or Firm*—Thomas R. FitzGerald, Esq.; Hiscock & Barclay, LLP (57) ABSTRACT

Merging together the drift regions in a low-power trench MOSFET device via a dopant implant through the bottom of the trench permits use of a very small cell pitch, resulting in a very high channel density and a uniformly doped channel and a consequent significant reduction in the channel resistance. By properly choosing the implant dose and the annealing parameters of the drift region, the channel length of the device can be closely controlled, and the channel doping may be made highly uniform. In comparison with a conventional device, the threshold voltage is reduced, the channel resistance is lowered, and the drift region on-resistance is also lowered. Implementing the merged drift regions requires incorporation of a new edge termination design, so that the PN junction formed by the P epi-layer and the $N^+$ substrate can be terminated at the edge of the die.

6 Claims, 16 Drawing Sheets

(PRIOR ART)

LOW VOLTAGE HIGH DENSITY TRENCH-GATED POWER DEVICE WITH UNIFORMLY DOPED CHANNEL AND ITS EDGE TERMINATION

CROSS-REFERENCE TO RELATED APPLICATIONS

This is a continuation of U.S. patent application Ser. No. 11/204,552 filed Aug. 16, 2005 which is a continuation of U.S. patent application Ser. No. 10/795,723 filed Mar. 5, 2004 which is a divisional application of U.S. patent application Ser. No. 10/138,913 filed May 3, 2002.

FIELD OF INVENTION

This invention relates to semiconductor power devices and their fabrication, and more specifically to low-voltage vertical MOSFET power devices.

DISCUSSION OF PRIOR ART

Recently, the personal portable electronics field, including such devices as cellular phones and notebook computers, has experienced explosive growth. The systematic reduction of supply voltage, accompanied by a corresponding decrease in device feature size and high system performance, has become a primary focus for the development of more advanced power devices. The voltage scaling of the total system requires that the power MOSFETs used in power management circuitry can be efficiently turned on and off at a low gate drive voltage. In order to meet this requirement, the power semiconductor switches should have a low level threshold voltage (less than 1.0 volts). See FIG. 1. To lower the threshold voltage, the prior art uses a low implant dose in P-well 30 plus a thinner gate oxide 40. This approach achieves a low gate rating, but it may result in a high channel leakage current and a poor high-temperature performance. Due to the low total net charges of the well, this approach also makes the device susceptible to punch-through breakdown. In addition, the doping in the channel is non-uniform.

Another recently-disclosed prior-art technique (shown in FIG. 2) employs the P-type epi-layer 70 forming the channel region of the device. The drift region 25 of the device is formed by implanting the opposite-type dopant into the trench bottom 55, followed by a thermal annealing step. Consequently, the doping concentration of the channel region is determined by the doping concentration of the epi-layer 70, and the doping profile along the device channel is uniform. This yields a higher total net charge located in the well for a given threshold voltage. Thus, the device's performance and off-state breakdown characteristics are expected to be improved. In this prior art, adjacent drift regions 25 clearly are not allowed to merge. The regions are kept separated to provide so-called "bulk resurf", so that the on-resistance of the device drift region 25 can be dramatically reduced [1]-[3].

As is well-known in the art, for low voltage power devices (for example, 30 volts or less) the on-resistance contribution from the drift region 25 is a very small portion of the total on-resistance. The most significant component of the device on-resistance is the resistance of the device channel region. In order to lower the channel resistance, the most efficient approach is to reduce the device unit cell pitch and increase the channel density. Unfortunately, the non-merging condition imposed on the drift regions 25 as taught in the prior art limits the minimum cell pitch and maximum channel density that the device can employ. As the result, the on-resistance of the prior art is high when used for a low voltage application. In addition, it is clear from FIG. 2 that the prior art creates more PN junction area of the device's body-diode, resulting in a high output capacitance. Also, the parasitic BJT of the body-diode has a significantly non-uniform base width. This will degrade the body-diode forward conduction and reverse recovery characteristics. [4]

SUMMARY

The invention merges together the drift regions in a low-power trench MOSFET device via a dopant implant through the bottom of the trench. The merged drift regions permit use of a very small cell pitch, resulting in a very high channel density and a consequent significant reduction in the channel resistance. By properly choosing the implant dose and the annealing parameters of the drift region, the channel length of the device can be closely controlled, and the channel doping may be made highly uniform. In comparison with a conventional device, the invention's threshold voltage is reduced, its channel resistance is lowered, and its drift region on-resistance is also lowered. To implement the merged drift regions, the invention incorporates a new edge termination design, so that the PN junction formed by the P epi-layer and the N+ substrate can be terminated at the edge of the die.

Figure 1:
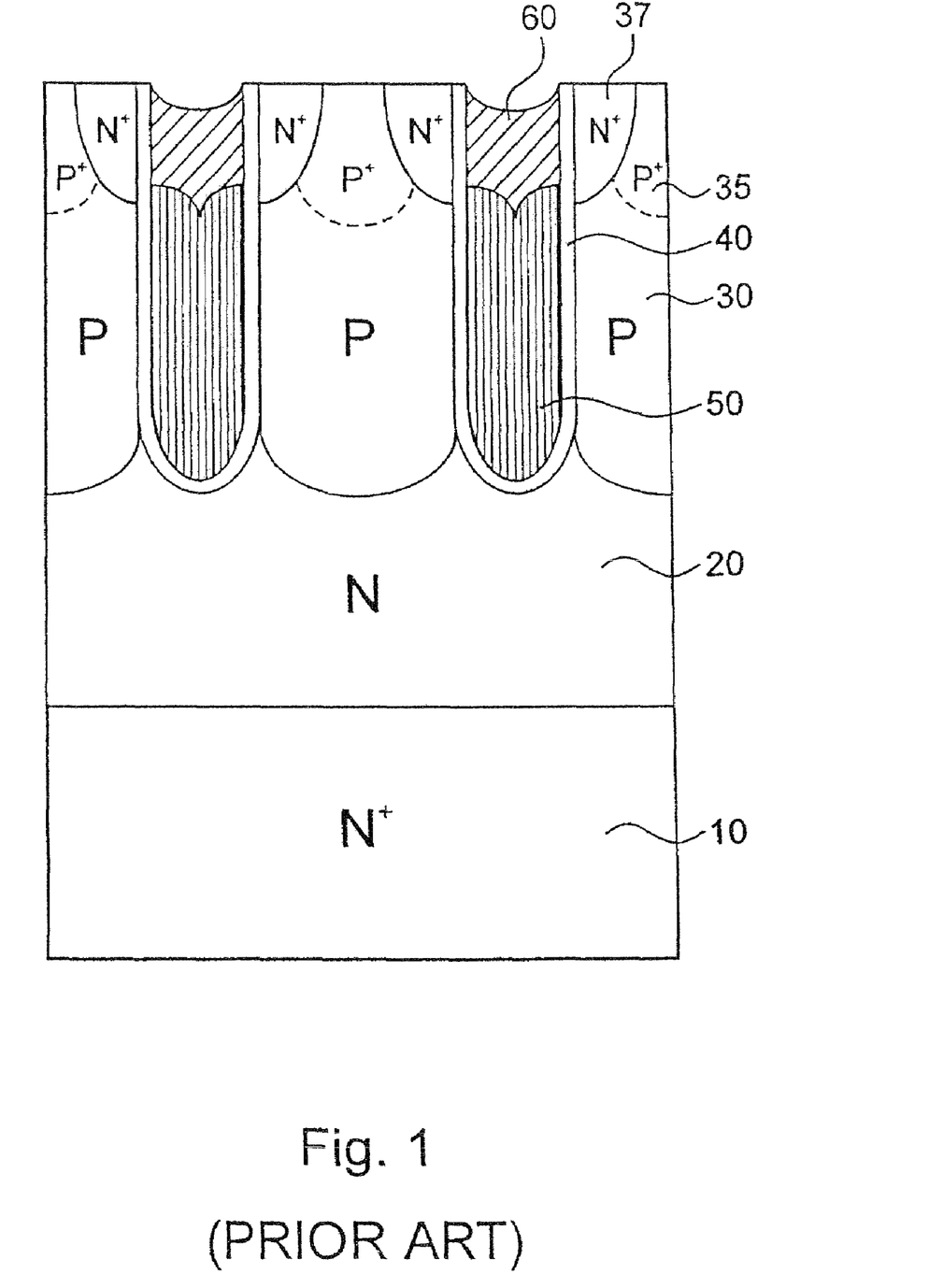
FIG. 1 shows a typical prior art device using a low implant dose and a thinner gate oxide.
Figure 2:
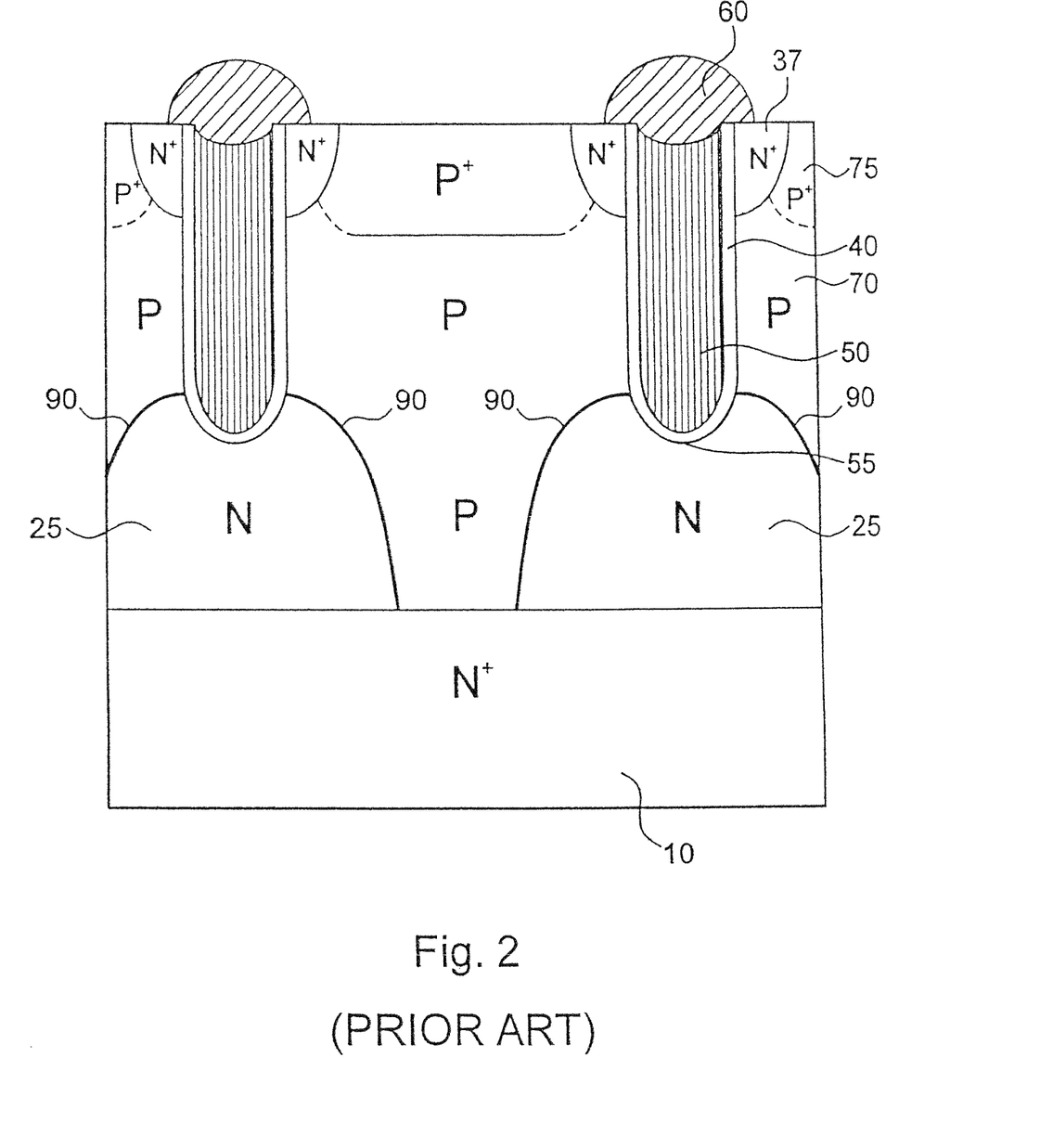
FIG. 2 shows a typical prior art device using an epi-layer forming the channel region of the device.

When compared to the prior art devices of FIG. 1, the more heavily P-type epitaxial layer of FIG. 2 reduces on resistance. In addition, the separated drift regions of FIG. 2 provide depletion regions to sustain a higher reverse voltage across the device. However, the requirement of the separated drift regions inherently reduces the density of the cells in a device. The invention provides low on resistance by using a more highly doped P-type epitaxial layer and has a higher cell density by allowing the drift regions to merge. Even with merged drift regions there is still adequate depletion to support high reverse biases. With the invention, the P-doping in the channel is more constant than the doping in prior art channels with epitaxial layers and separated drift zones. The invention provides devices with greater cell density and lower junction capacitance than devices made with separated resurf regions.

DETAILED DESCRIPTION OF INVENTION

Figure 3:
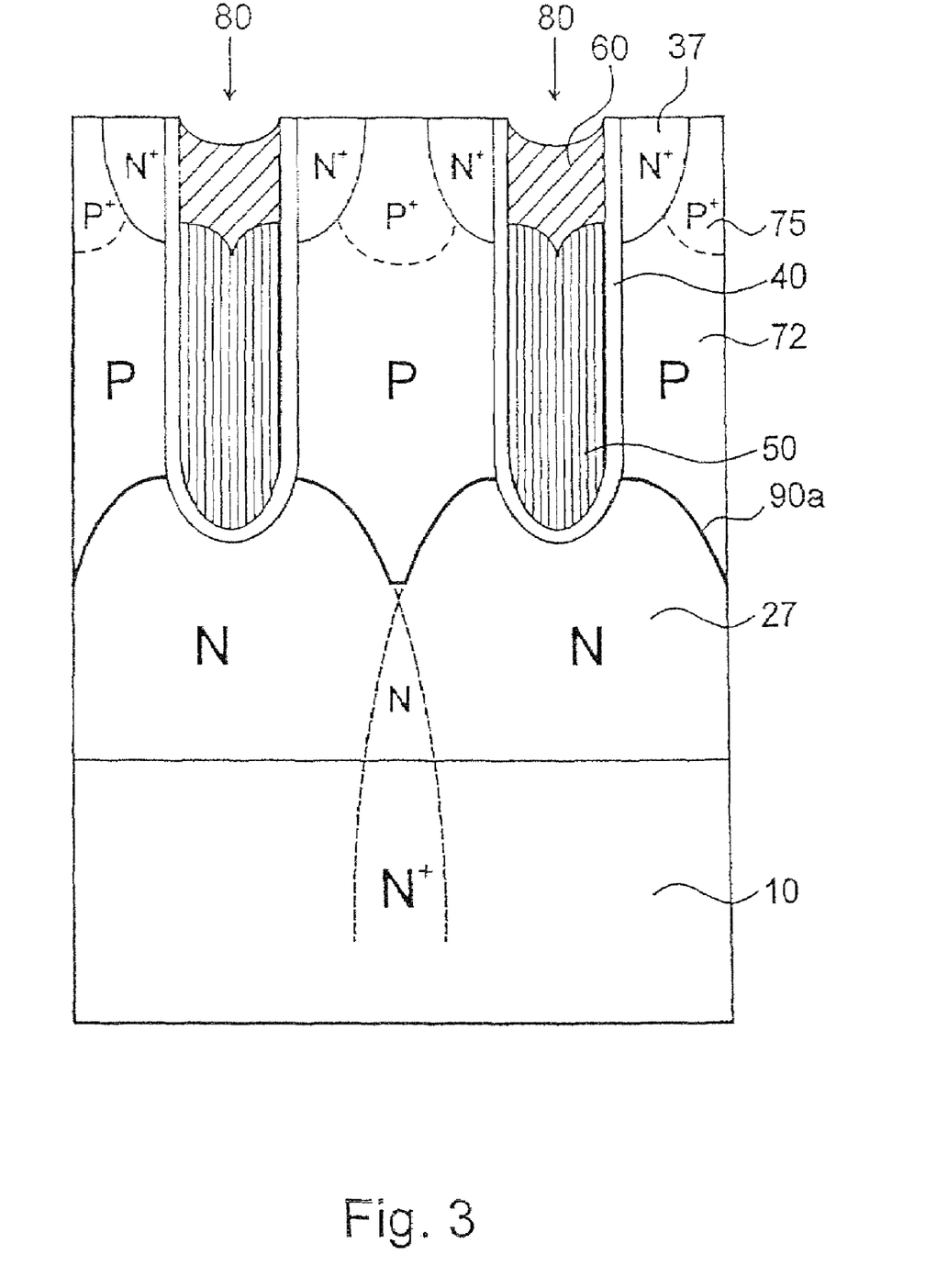
FIG. 3 shows the invention in a first embodiment with significant reduction of channel resistance.

This invention addresses and resolves the problems of the prior art devices described above. See FIG. 3. The invention's device comprises an N$^+$-type substrate 10, N-type drift regions 27, a P-type epi-layer 72, trenches 80, gate oxide 40, polysilicon 50, BPSG 60, N$^+$-type source regions 37, and P$^+$-type body regions 75. The illustrated conductivity types may of course be reversed as needed. By contrast with the prior art, the invention merges together the implanted drift regions 27. The prior art of FIG. 2 keeps the regions separated to provide a bulk resurf effect that lowers the on resistance and increases the depletion of the drift region during reverse voltage conditions to raise the limits of the sustaining reverse voltage. Instead of the long, slanted boundary 90 between P-type epi-layer 70 and drift region 25 as shown in FIG. 2, the invention produces a shorter, more-level boundary 90$a$ between P-type epi-layer 72 and drift region 27 as shown in FIG. 3. In effect, the invention reduces significantly the surface area between the epi-layer and the drift region, and separates the epi-layer completely from the substrate. Merging the drift regions permits use of a very small cell pitch and results in a very high channel density. Thus, the invention achieves a significant reduction in the channel resistance. Furthermore, the channel length of the device can be controlled by preferably choosing one or more parameters, including and not limited to the implant dose and implant as well as the temperature and time of the annealing step for driving in the implanted dopants.

Figure 4:
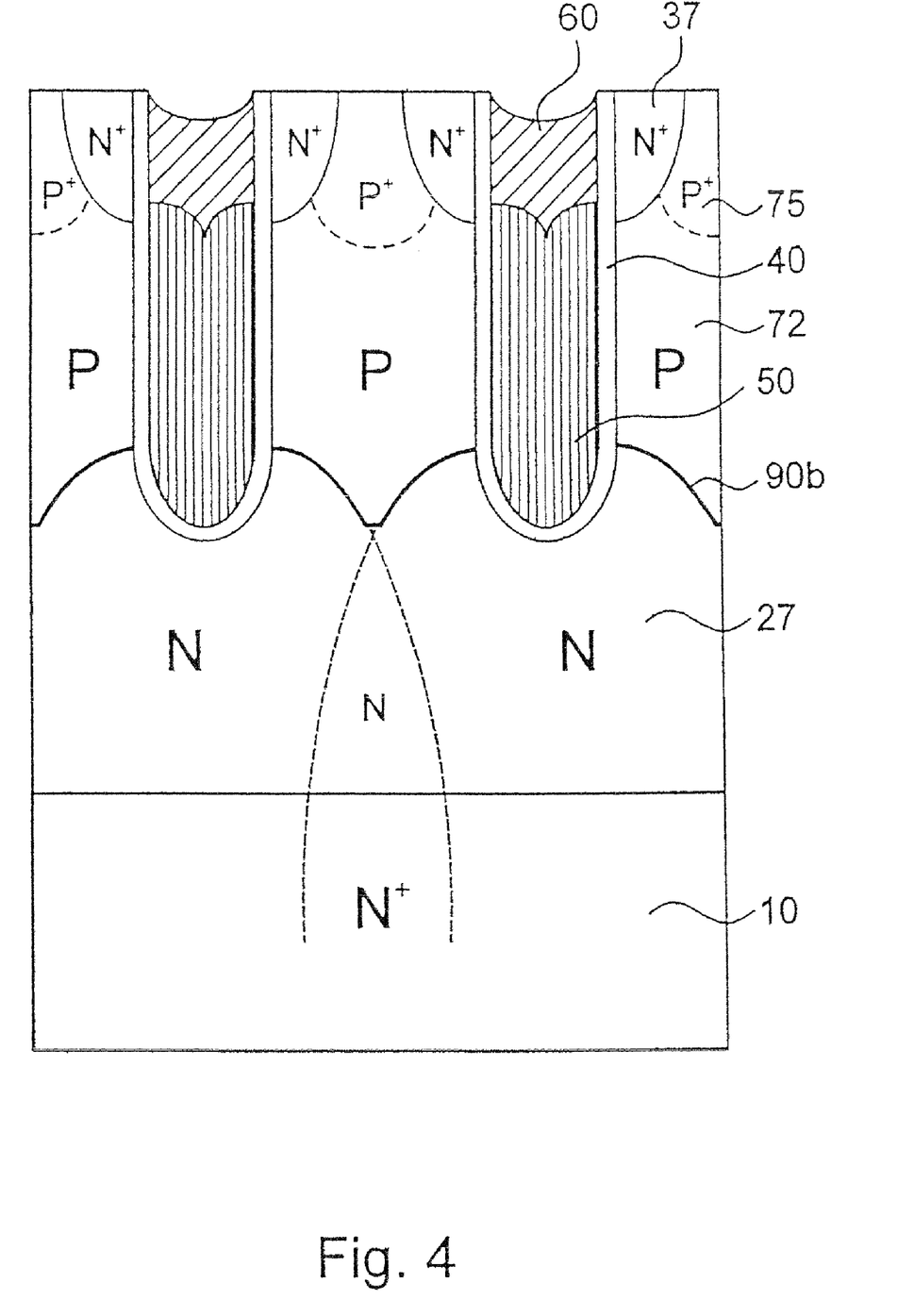
FIG. 4 shows the invention in a second embodiment with further significant reduction of channel resistance.
Figure 5:
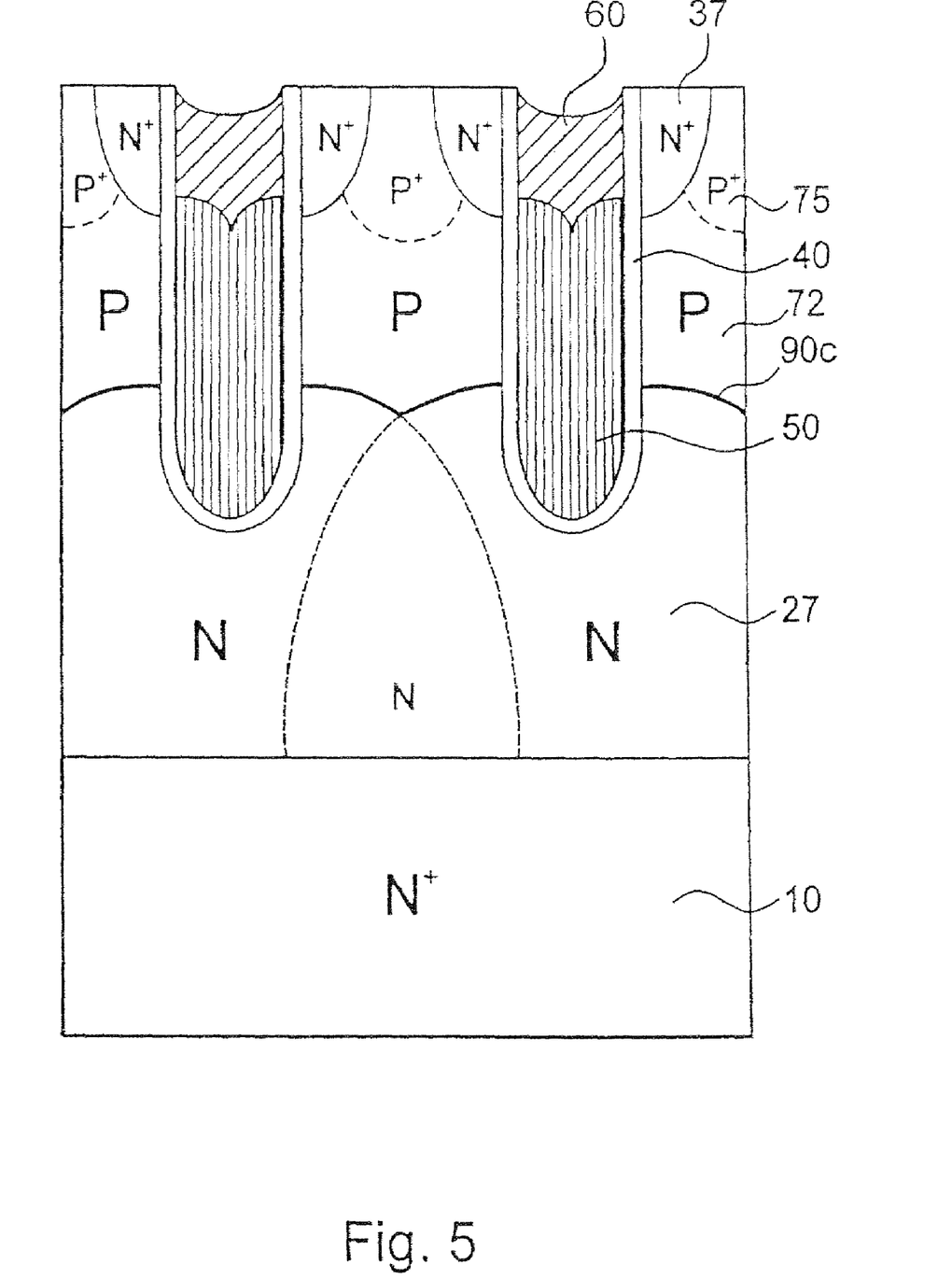
FIG. 5 shows the invention in a third embodiment with still further significant reduction of channel resistance.
Figure 5A:
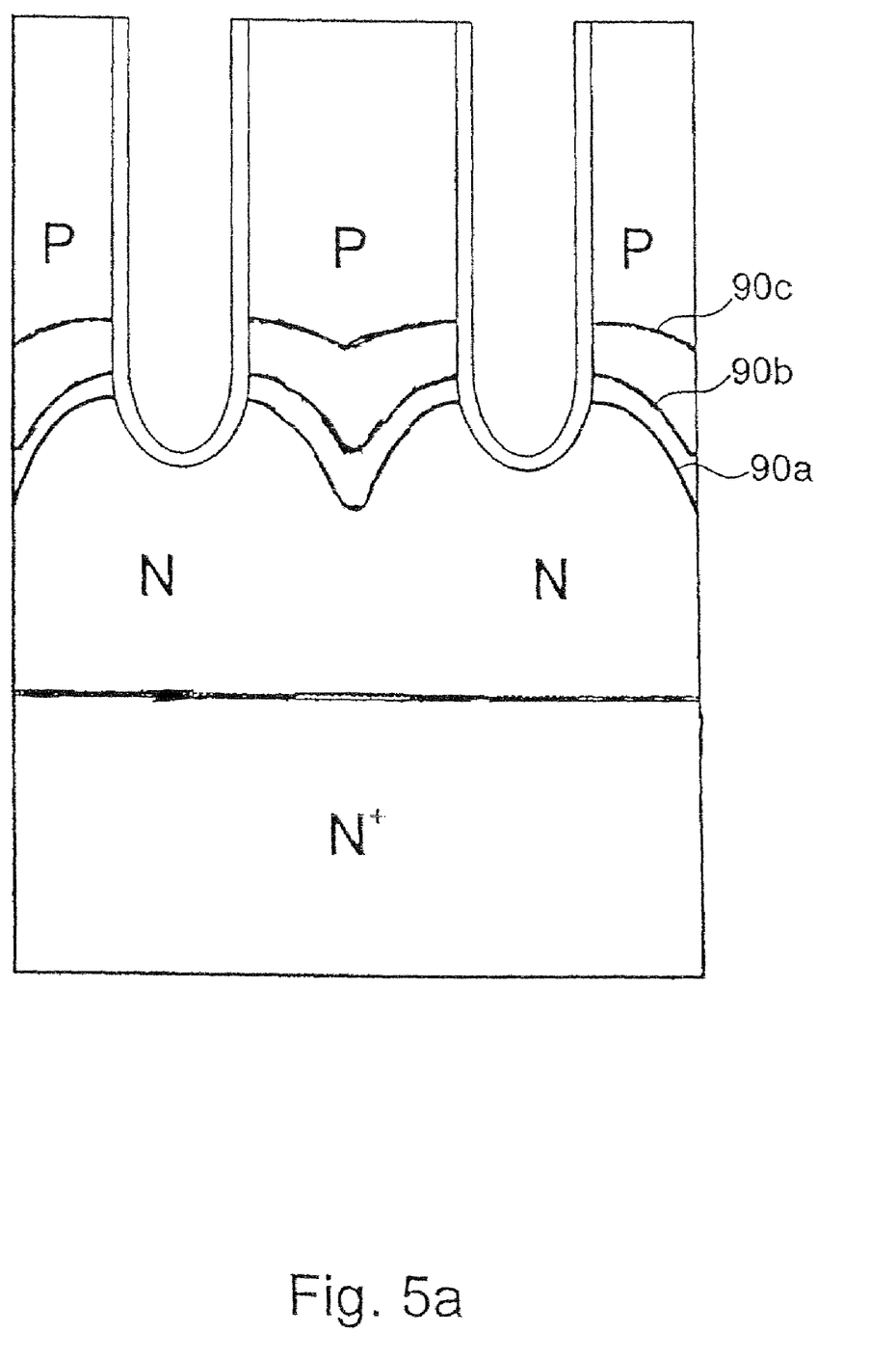
FIG. 5a shows a comparison of the three embodiments shown in FIGS. 3, 4, and 5.
Figure 6:
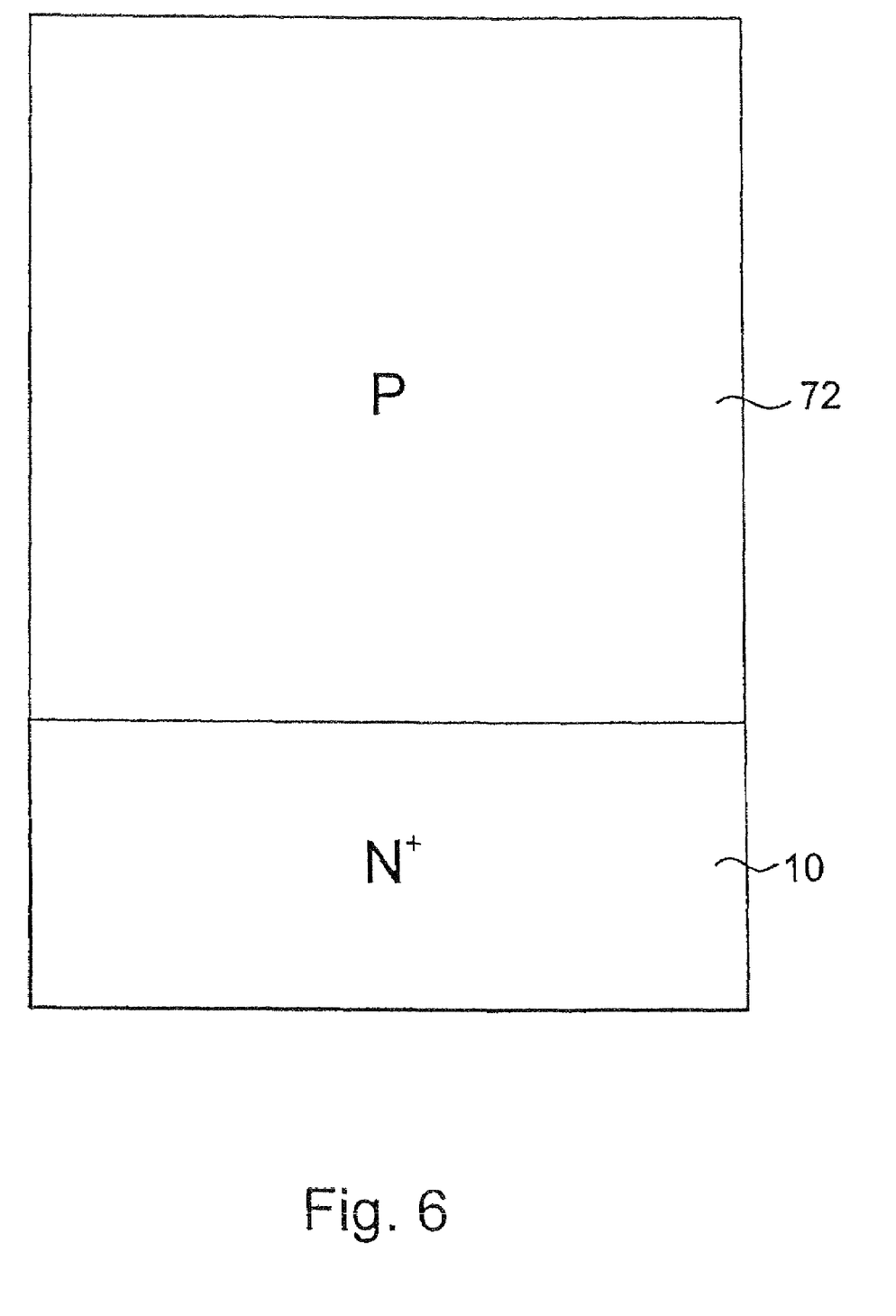
FIGS. 6 through 10 show the important steps in fabrication of the invention.
Figure 7:
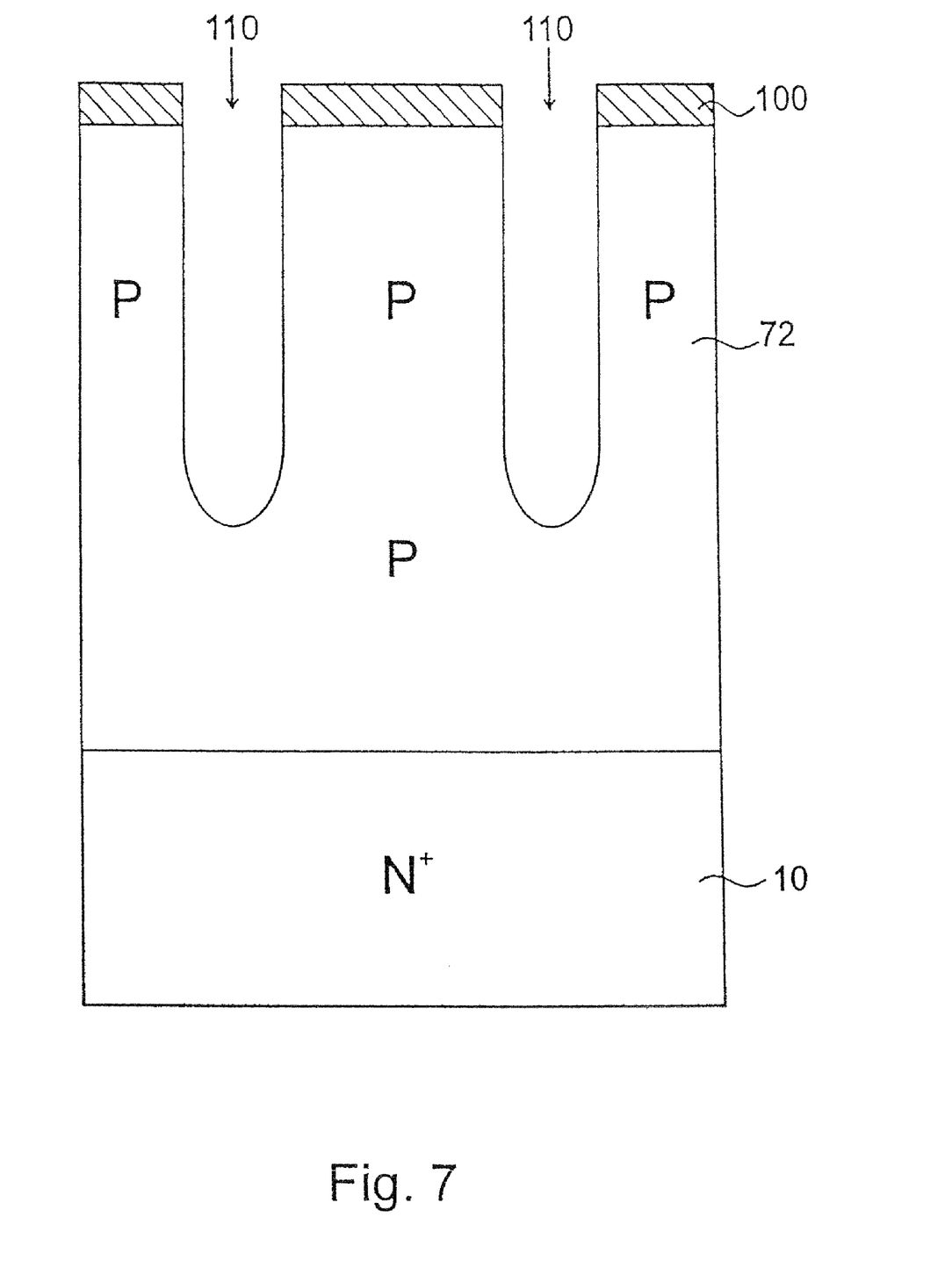
Figure 8:
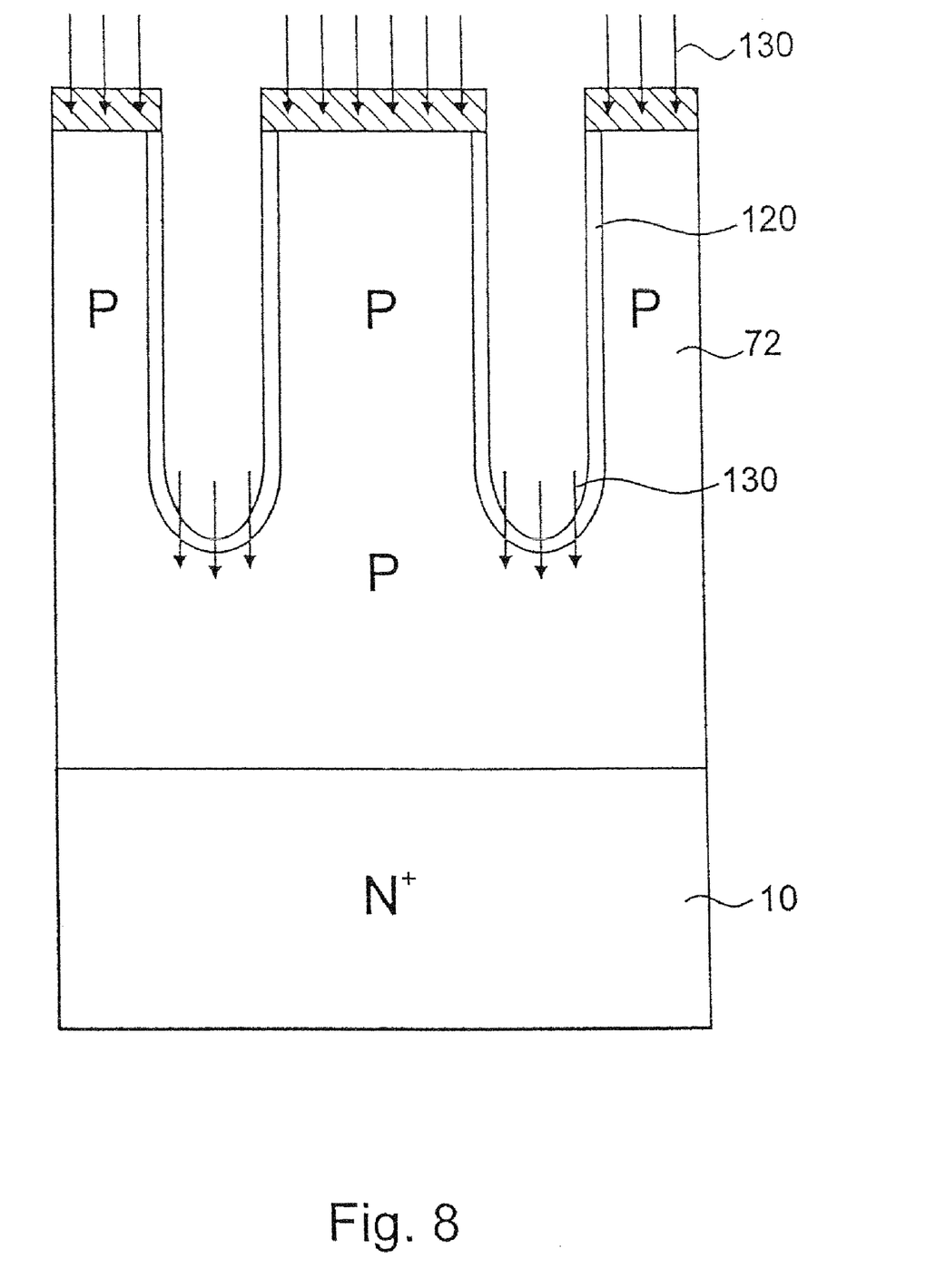

As an example, a shorter channel can be achieved by increasing the driven time after the drift region implant. The shorter channel length produces a significant decrease in the channel resistance. This is depicted in FIGS. 3, 4, and 5, in which the driven time changes from 10 min (FIG. 3), to 20 min (FIG. 4), and to 30 min (FIG. 5). Note the progressive increase in thickness of the drift region 27, and the flattening of the boundary 90$a$, 90$b$, 90$c$ between the drift region and the overlying epi-layer 72. In addition, the device forward current spreading inside the drift region is progressively more efficient as the driven time increases (see FIG. 3 to FIG. 5 in order) due to a wider spreading area. Consequently, the on-resistance of the drift region is also lowered. To help make clear the differences, FIG. 5$a$ shows the three different cases in one illustration.

The forward conduction characteristics of the devices in FIG. 3, FIG. 4 and FIG. 5 have been simulated by using the finite element method. The modeled device on-resistance was extracted from the simulation results. The on-resistance per unit area of devices of FIGS. 3, 4, and 5 are 0.22 mΩcm$^2$, 0.18 mΩ/cm$^2$ and 0.15 mΩ/cm$^2$ respectively. The cell pitch of all the devices is 2.0 microns. Additionally, when compared to the prior art shown in FIG. 2, the body-diode of the new device proposed in this invention as illustrated in FIGS. 3, 4, 5, and 5$a$ has significantly less PN junction area. Also, the base width of the parasitic BJT of the new device's body-diode becomes more even. The body-diode of the inventive device provides improved forward conduction and reverse recovery characteristics.

In the fabrication process described in the following paragraphs, a 30V N-Channel trench-gated power MOSFET is used as an example to demonstrate the realization of the concept disclosed in this invention. Only the important process steps are illustrated.

Devices including the invention are made with the inventive process illustrated in FIGS. 6-10. The process begins with an N+ substrate 10 of silicon or other suitable semiconductor material. A p-type epitaxial layer 72 is grown on the substrate 10 in a manner well known in the art. Trenches 110 for holding gate structures are opened by covering the epitaxial layer 72 with a suitable mask. In one embodiment a hard mask 100 of silicon dioxide is either deposited or thermally grown on the top of the epitaxial layer 72. A layer of photoresist is deposited on the oxide 100 and then patterned to exposed portions of the oxide. The exposed portions of the oxide 100 are removed by a suitable etch to expose portions of the epitaxial layer 72 where the trenches 100 will be formed. The substrate 10 is then etched to remove epitaxial material from the substrate and form the trenches 110.

Next, a relatively thin gate oxide layer 120 is thermally grown on the exposed sidewall and floor surfaces of the trenches. Then the substrate is implanted with N-typed dopants 130, such as phosphorous or arsenic. The residual oxide mask 100 on the epitaxial layer 72 blocks the N-type dopants from entering the upper surface of that layer. The thinner oxide layer 120 on the sidewalls and floors of the trenches allow the implanted N-type ions 130 to enter the epitaxial layer 72 in regions proximate the floors of the trenches.

Figure 9:
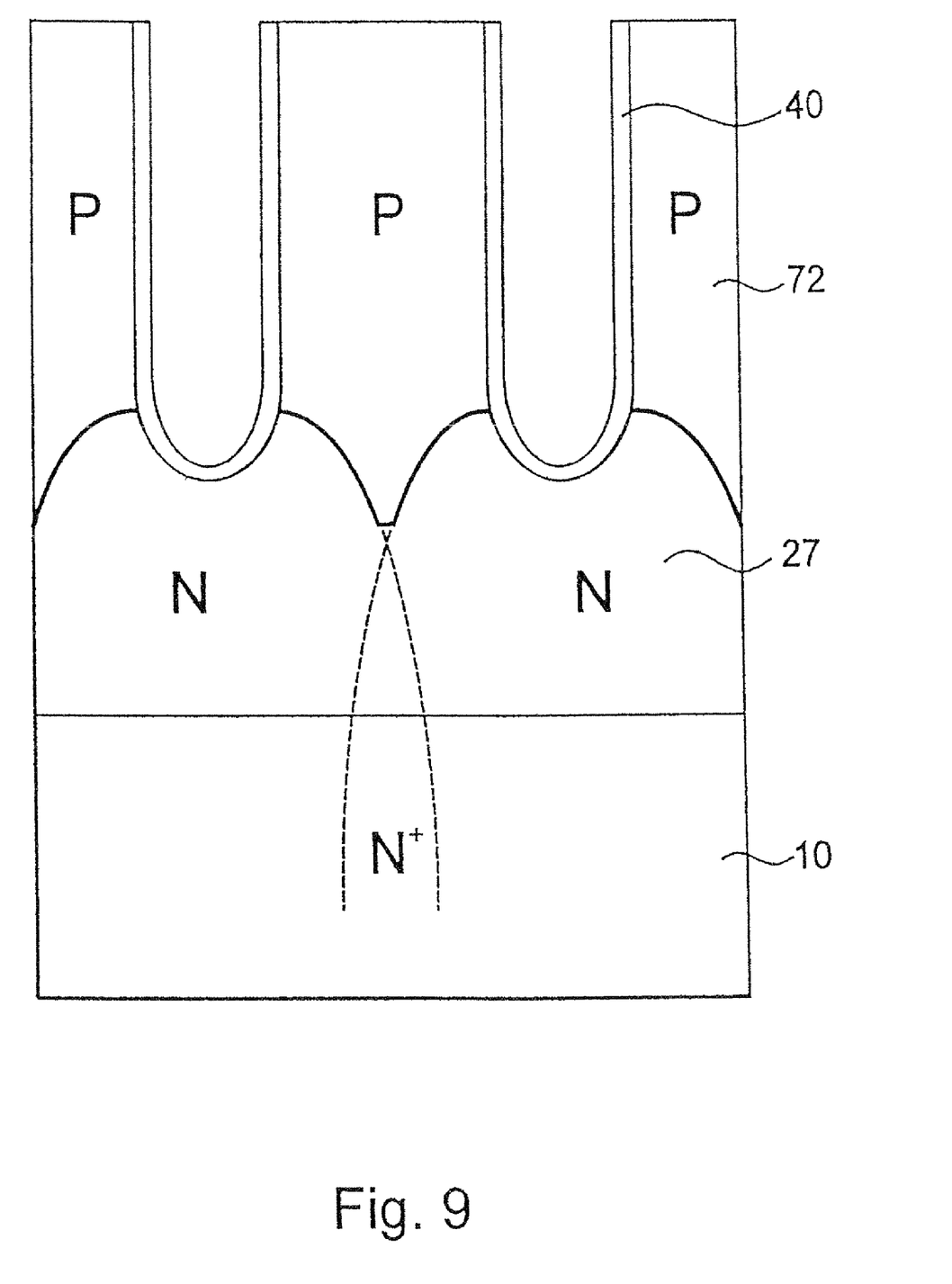

Turing to FIG. 9, the hard mask 100 is removed from the surface and the implanted ions 130 are driven in by an annealing operation. The drive-in step diffuses the N-type ions in a vertical direction enough to reach the N+substrate and in a lateral direction to extend across the lower portion of the epitaxial layer 72 and form an unbroken N-type drift region 27 along the bottom of the epitaxial layer 72. Those skilled in the art will understand that the height of the N-type region 27 depends upon a number of factors, including and not limited to, the type of dopant used the implant energy, the concentration, and the annealing or drive-in time. One or more of the factors are adjusted to achieve the desired net concentration and height of the region 27.

Figure 10:
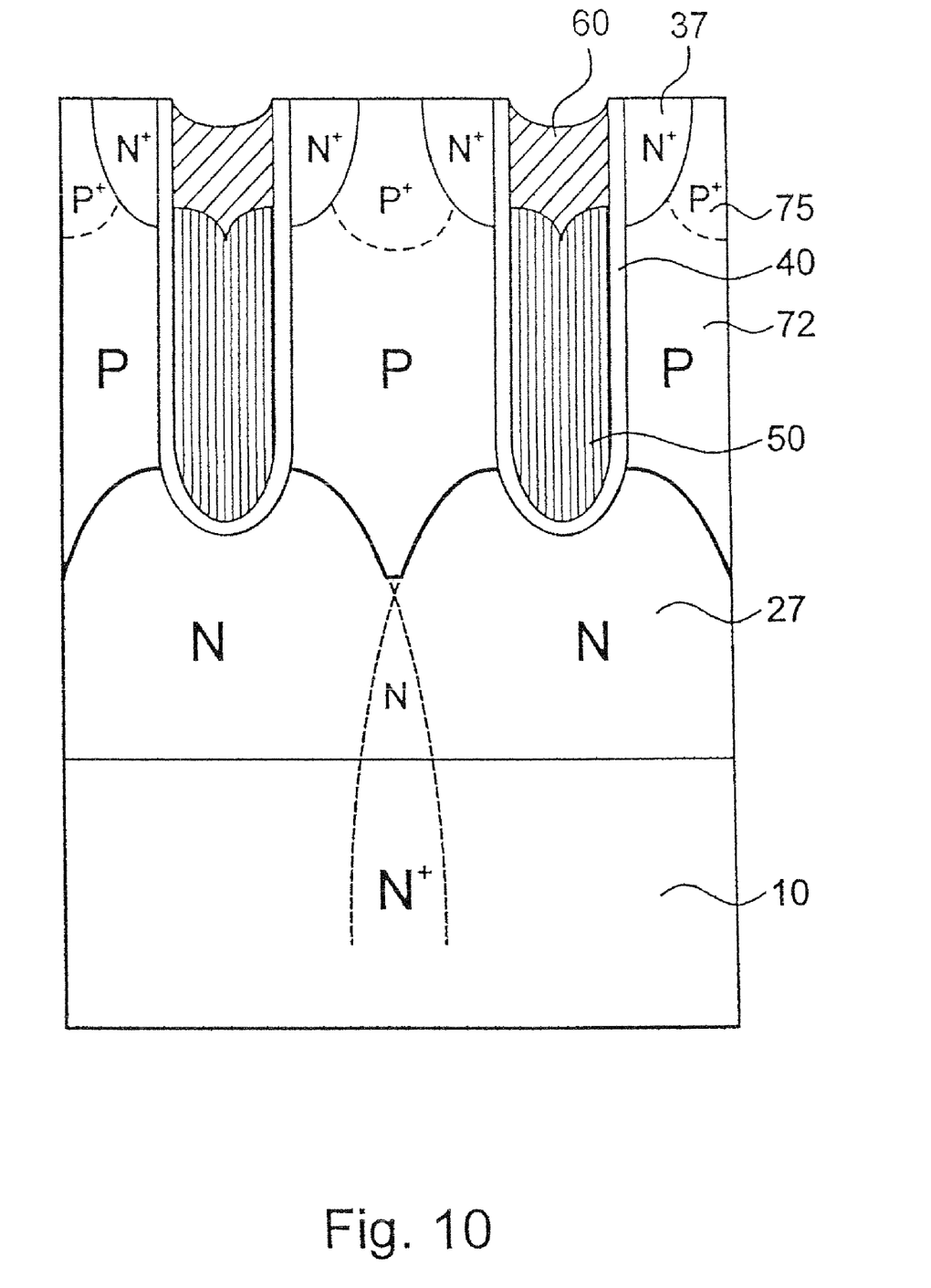

See FIG. 10. The remaining process steps are standard, including filling the trenches with doped polysilicon, followed by etching a recess in the polysilicon, deposition of an inter-level r-dielectric layer (such as BPSG) fill 60 and etch back to form the self-isolated buried polysilicon gate. Standard procedures may be used to create the P+ body 75 and the N+ source 37, followed by front-side and back-side metallizations.

Figure 11:
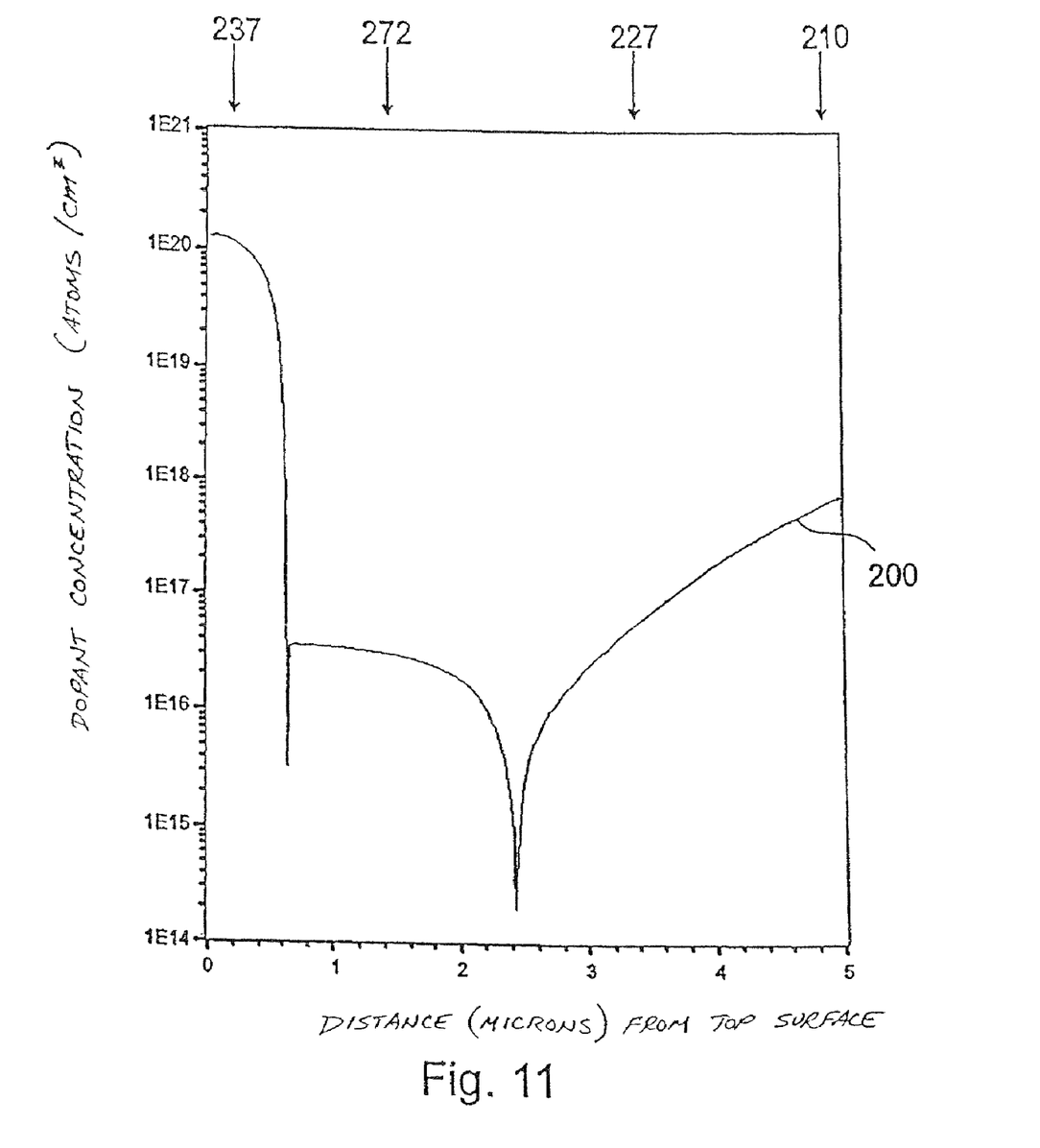
FIG. 11 shows the invention's doping profile along the trench sidewall.
Figure 12:
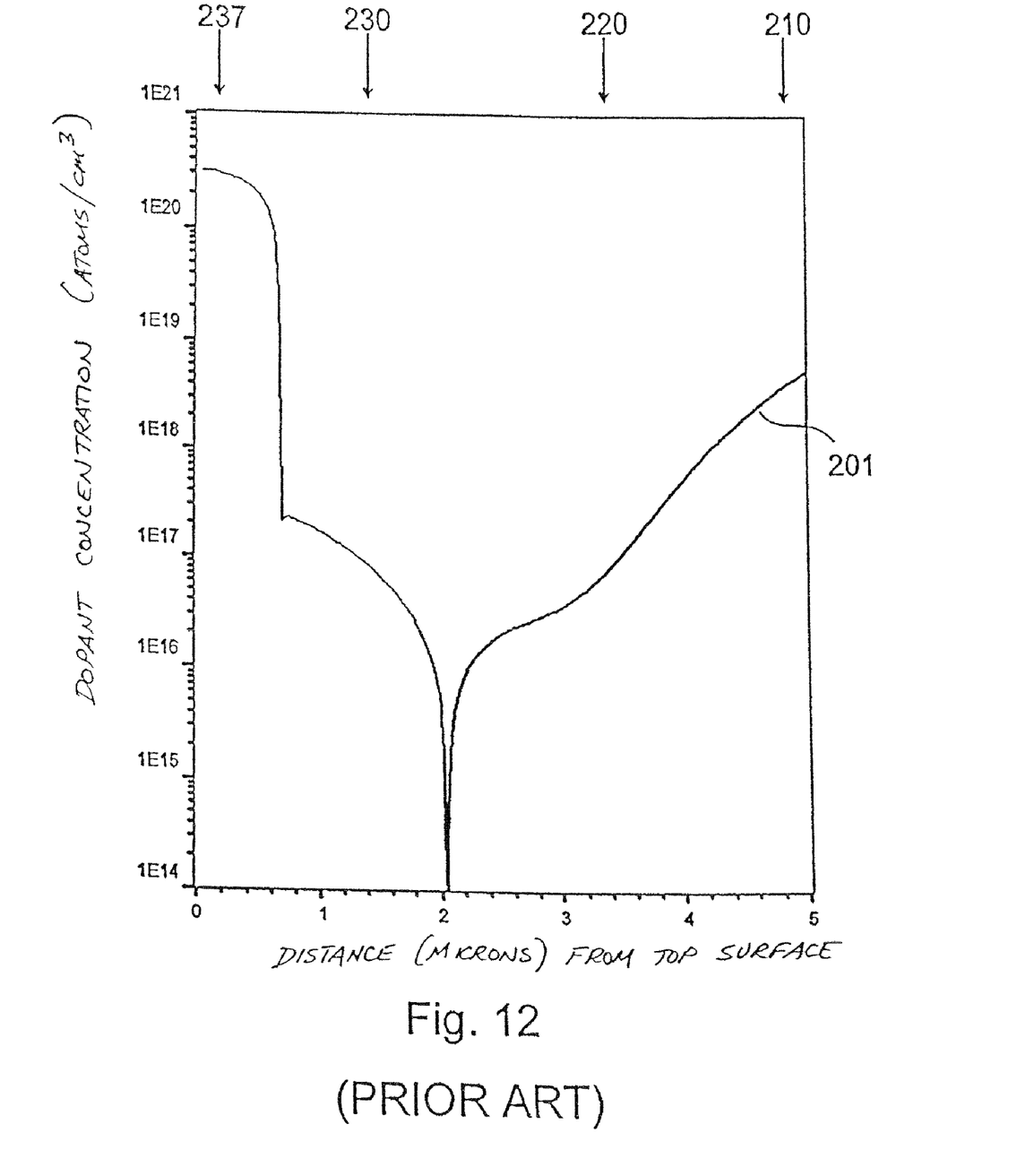
FIG. 12 shows the doping profile along the trench sidewall for a prior art device.
Figure 13:
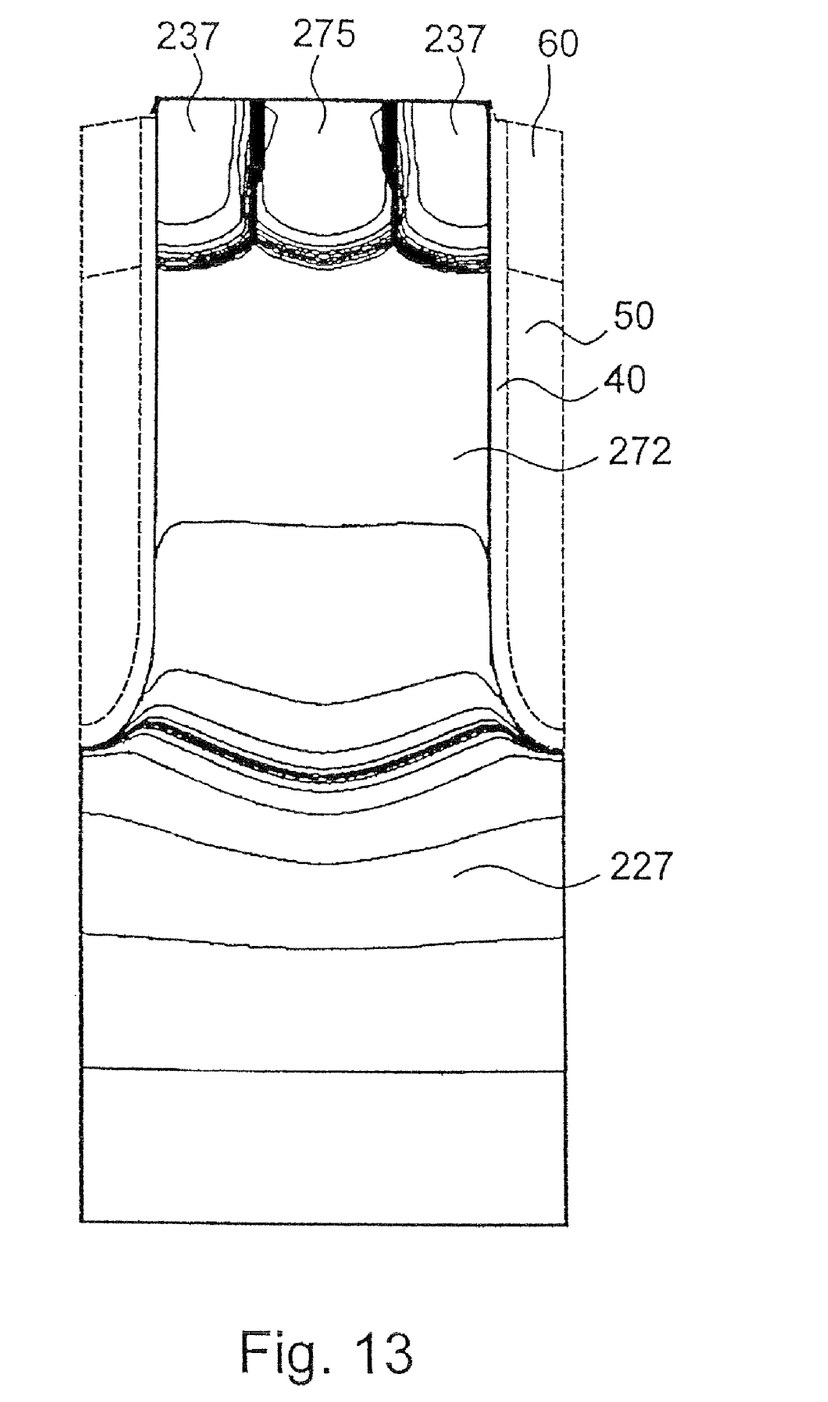
FIG. 13 shows the contours of doping concentration in the invention.

The detailed process described in the previous paragraphs has been simulated and verified. The prior art shown in FIG. 1 was also simulated for comparison. FIG. 11 gives the doping profile 200 along the trench sidewall of the device disclosed in this invention, showing the profile through N$^+$ source region 237, P-type epi-layer 272 (channel), N-type drift region 227, and N$^+$ substrate 210. FIG. 12 gives the doping profile 201 along the same location of the prior art device, showing the profile through N$^+$ source region 237, P-well 230 (channel), epi-layer 220, and N$^+$ substrate 210. The channel length and the channel doping concentration have been properly designed so that both devices exhibit non-punch-through breakdown characteristics. The drain-source breakdown voltages are 35 volts and 34 volts respectively for the new device of FIG. 11 and the standard device of FIG. 12. However, the threshold voltage of the new device is about 0.7 volts, but 2.0 volts for the standard device. FIG. 13 shows the contours of doping concentration inside the new device, through N$^+$ source regions 237, P$^+$ body regions 275, P-type epi-layer 272 (channel), and N-type drift region 227. Gate oxide 40, polysilicon 50, and BPSG 60 are shown for clarity. It is evident that the doping concentration is almost constant in the channel region 272.

Figure 14:
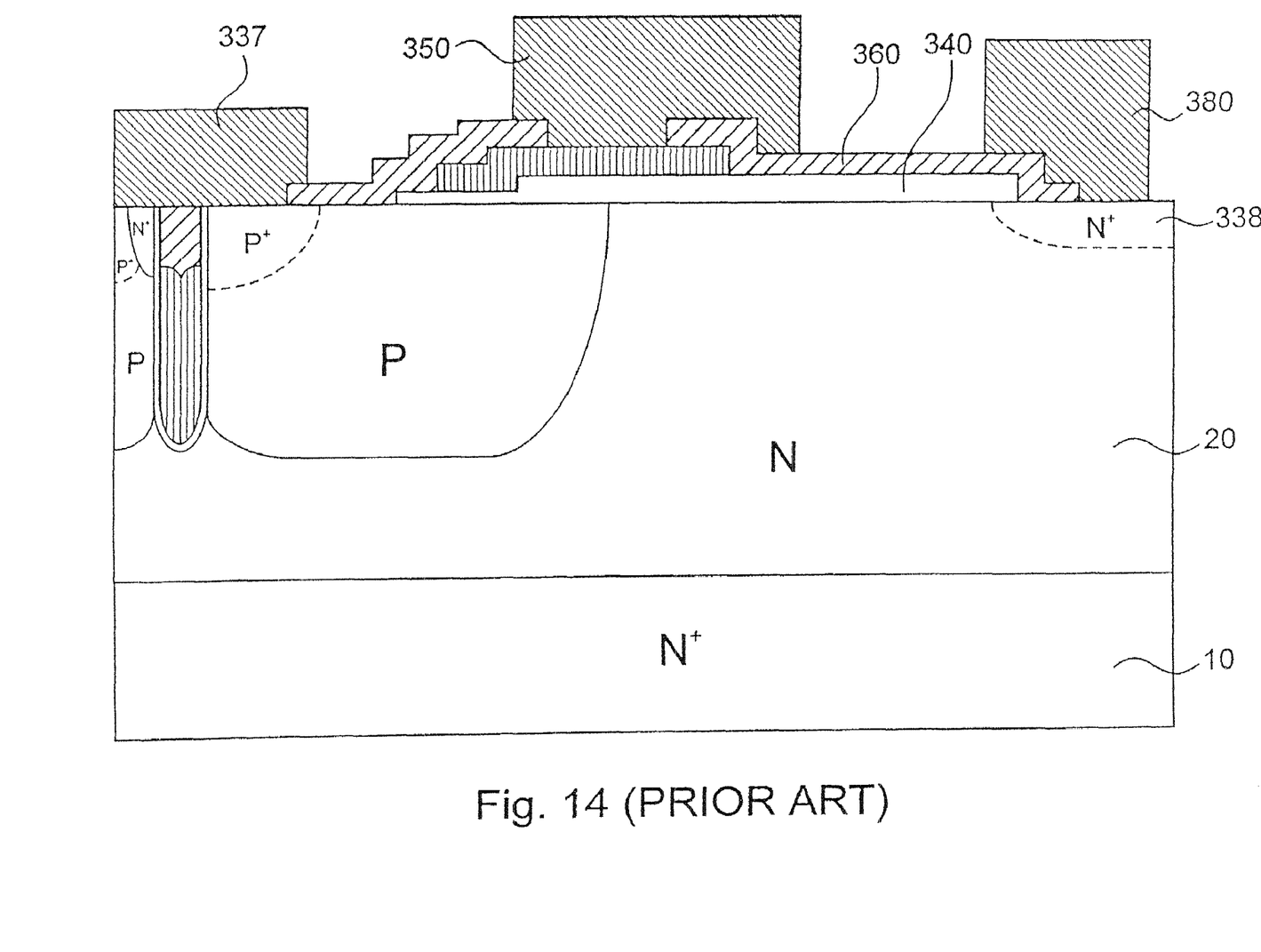
FIG. 14 shows the most commonly used edge termination in prior art devices.
Figure 15:
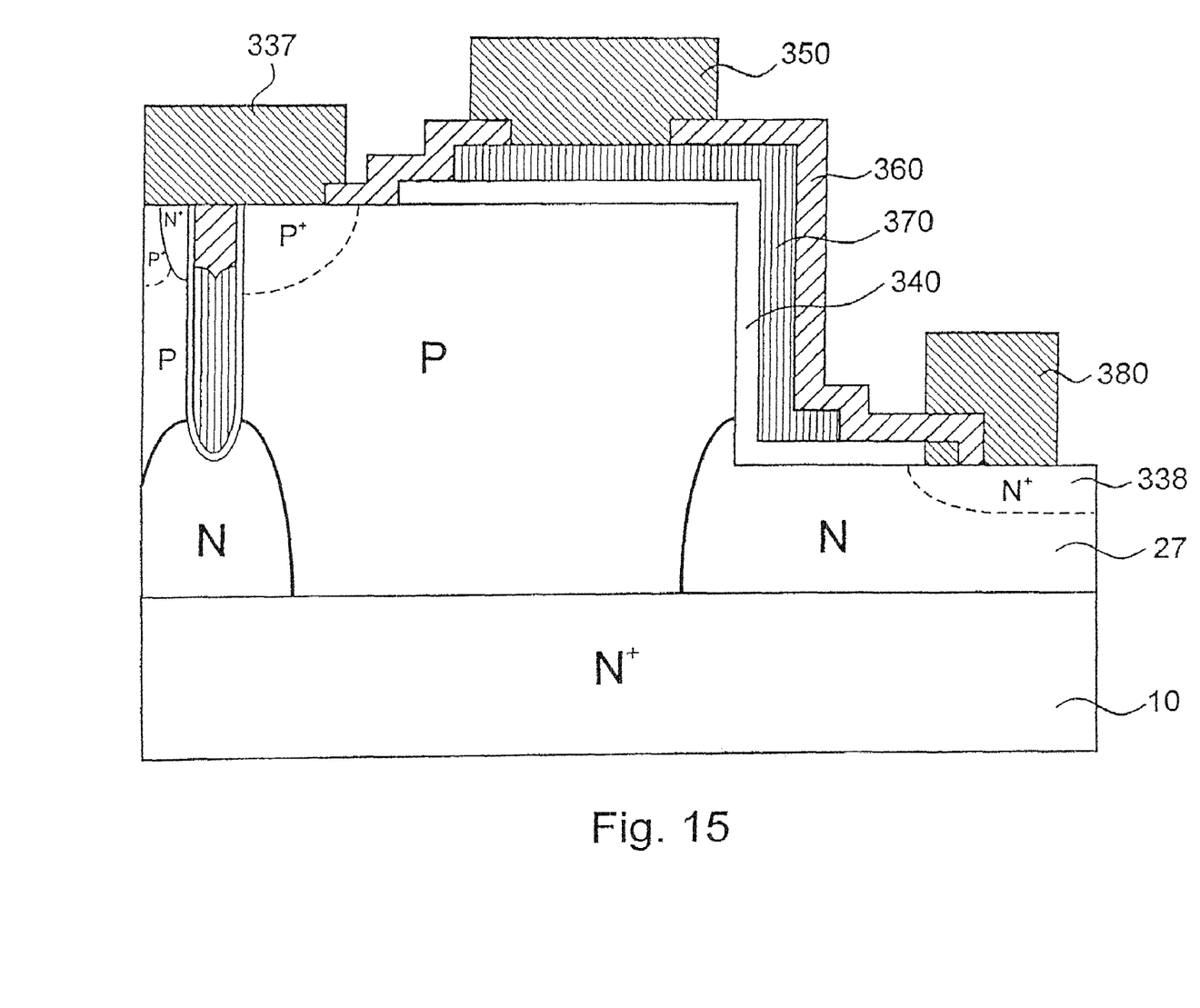
FIG. 15 shows the edge termination used in the invention.

Finally, it is important to point out that in the new device the PN junction formed by the P epi-layer and the N$^+$ substrate does not terminate at the silicon surface. As a consequence, the edge termination used for the conventional device of FIG. 1 can not be applied to the new device disclosed in this invention or the prior art of FIG. 2. Currently, the most frequently used edge termination in conventional low voltage MOSFET is depicted in FIG. 14, with source metal 337, gate runner metal 350, BPSG 360, field oxide 340, channel stopper metal 380, N+ channel stop 338, epi-layer 20, and substrate 10. In order to address this issue, this invention provides a new edge termination as shown in FIG. 15. The edge of the die is etched away and a field oxide 340 is grown over the etched edge. A layer of doped polysilicon 370 is formed on the field oxide followed by insulating BPSG layer 360. Openings are made in that layer for the metal gate runner 350 to contact the polysilicon plate layer 370. An N+ drift contact region 338 is formed on the lower outer edge of the die for contacting the edge drift region 27. A channel stopper metal layer 380 contacts the region 338 through suitable openings in the field oxide 340, polysilicon layer 370 and BPSG layer 360. This new edge termination is produced by using the same process flow as the active device. The new edge termination has a more efficient utilization of silicon area, due to the fact that the partials of the polysilicon field plate 370 and the metal gap between metal strips 350 and 380 are located along the trench sidewall. In addition, because of lower doping concentration of the P epilayer compared to the concentration of the P well in the standard device of FIG. 1, the electric field spreads more into the P epilayer. Consequently, for a given breakdown voltage, the new edge termination presents a smaller lateral dimension than the conventional one.

REFERENCES

[1] Coe, U.S. Pat. No. 4,754,310, 1988.

[2] Chen, U.S. Pat. No. 5,216,275, 1993.

[3] Tihanyi, U.S. Pat. No. 5,438,215, 1995.

[4] Jun Zeng, C. Frank Wheatley, Rick Stokes, Chris Kocon, and Stan Benczkowski, "Optimization of the body-diode of power MOSFETs for high efficient synchronous rectification," ISPSD '2000, pp. 145-148.

CONCLUSION, RAMIFICATIONS, AND SCOPE OF INVENTION

From the above descriptions, figures and narratives, the invention's advantages in providing a low-voltage high-density trench-gated power MOSFET device should be clear.

Although the description, operation and illustrative material above contain much specificity, these specificities should not be construed as limiting the scope of the invention but as merely providing illustrations and examples of some of the preferred embodiments of this invention.

Thus the scope of the invention should be determined by the appended claims and their legal equivalents, rather than by the examples given above.

The invention claimed is:

1. A power mosfet with trench gates comprising:
a semiconductor substrate;
a drain layer on one surface of the substrate doped with a high concentration of a dopant of one polarity;
an epitaxial layer above the drain layer that is substantially uniformly lightly doped with a dopant of opposite polarity;
a source layer at the other surface of the substrate and doped with a high concentration of the same dopant as the drain layer;
a plurality of trenches penetrating the source layer, said trenches substantially filled with conductive material; and
a drift layer in the substrate comprising a dopant of the same polarity as the drain and forming a continuous undulating pn junction extending between two adjacent trenches with the substantially uniformly lightly doped epitaxial layer.

2. The power mosfet of claim 1 wherein the drift layer between two adjacent trenches has a dopant concentration that fluctuates along a line between the two adjacent trenches.

3. A power mosfet with trench gates comprising:
a semiconductor substrate;
a drain layer on one surface of the substrate doped with a high concentration of a dopant of one polarity;
an epitaxial layer above the drain layer that is substantially uniformly lightly doped with a dopant of opposite polarity;
a source layer at the other surface of the substrate and doped with a high concentration of the same dopant as the drain layer;
a plurality of trenches penetrating the source layer, said trenches substantially filled with conductive; and
a drift layer in the substrate comprising a dopant of the same polarity as the drain and forming a continuous undulating pn junction extending between two adjacent trenches with the substantially uniformly lightly doped epitaxial layer;
a BPSG layer over the gate material in the trenches; and
an edge termination having a vertical face comprising a layer of field oxide, a layer of polysilicon, and a layer of BPSG over the epitaxial region and a recessed outer horizontal face, a heavily doped region on outer edge of the die to form a channel stop region in the epitaxial layer and a channel stopper metal layer over and in contact with the channel stop region.

4. The power mosfet of claim 3 further comprising channel regions in the epitaxial layer adjacent the gate insulating layer of the trenches wherein the dopant concentration in the channel regions are substantially flat across most of the channel.

5. The power mosfet of claim 1, 3 or 4 wherein the conductive material in the trench comprises doped polysilicon.

6. The power mosfet of claim 3 wherein the drift layer between two adjacent trenches has a dopant concentration that fluctuates along a line between the two adjacent trenches.

* * * * *